United States Patent
Guo et al.

(10) Patent No.: US 8,203,395 B2
(45) Date of Patent: Jun. 19, 2012

(54) WAVE GUIDING STRUCTURES FOR CROSSTALK REDUCTION

(75) Inventors: Fei Guo, Richmond Hill (CA); Xiao Ling Shi, North York (CA); Mark Frankovitch, Markham (CA); Wasim Ullah, Thornhill (CA)

(73) Assignee: ATI Technologies ULC, Markham (CA)

( * ) Notice: Subject to any disclaimer, the term of this patent is extended or adjusted under 35 U.S.C. 154(b) by 372 days.

(21) Appl. No.: 12/542,447

(22) Filed: Aug. 17, 2009

(65) Prior Publication Data

US 2011/0037528 A1    Feb. 17, 2011

(51) Int. Cl.
*H01P 3/08*    (2006.01)

(52) U.S. Cl. .......................................... 333/1; 333/238

(58) Field of Classification Search .................. 333/1, 4, 333/5, 238
See application file for complete search history.

(56) References Cited

U.S. PATENT DOCUMENTS

| 4,490,690 | A  | * | 12/1984 | Suzuki ............................. 333/1 |
| 6,531,932 | B1 |   | 3/2003  | Govind et al. |
| 6,863,549 | B2 | * | 3/2005  | Brunker et al. ............... 439/108 |
| 7,170,361 | B1 | * | 1/2007  | Farnworth ........................ 333/1 |

OTHER PUBLICATIONS

Aaron Edwards; *High-Performance Packaging Designs*; High Speed Design Forum; ANSOFT Corporation; Jun. 2002; pp. 1-30.

* cited by examiner

*Primary Examiner* — Stephen Jones
(74) *Attorney, Agent, or Firm* — Timothy M. Honeycutt (57) ABSTRACT

Various apparatus and methods of addressing crosstalk in a circuit board are disclosed. In one aspect, a method of manufacturing is provided that includes forming a first layer of a circuit board with a first signal trace and forming a second layer of the circuit board with a second signal trace. A first guard trace is formed on the first layer and offset laterally from the first signal trace but at least partially overlapping the second signal trace and a second guard trace is formed on the second layer and offset laterally from the second signal trace but at least partially overlapping the first signal trace.

33 Claims, 5 Drawing Sheets

WAVE GUIDING STRUCTURES FOR CROSSTALK REDUCTION

BACKGROUND OF THE INVENTION

1. Field of the Invention

This invention relates generally to semiconductor processing, and more particularly to methods and apparatus for reducing crosstalk in circuit boards.

2. Description of the Related Art

Circuit boards of various types, including semiconductor chip package substrates and circuit cards, utilize conductor lines or traces to convey signals from one point to another. Crosstalk between signal traces due to capacitive and/or inductive coupling can lead to highly undesirable levels of noise propagating through the circuit board. The level of crosstalk is normally dependent upon a variety of factors, such as operating frequency, the dielectric constant of the medium between the crosstalking signal traces as well as the spacing and geometry of the signal traces. With the continuing trend in device manufacture toward increasing miniaturization and higher operating frequencies for signal traces, the problem of crosstalk can place limits on the ability to shrink designs.

Although crosstalk can present problems for various types of signal traces, some types of interfaces may be more prone to interference. Single-ended high speed interfaces such as those used for double data rate and graphics double data rate memory channels may be particularly susceptible to crosstalk due to the ever increasing operating frequencies of these types of channels.

Various conventional techniques exist to address the problem of crosstalk between signal traces. One conventional technique involves the selection of minimum spacing between signal traces above a predetermined level that will yield an acceptable level of crosstalk. Of course this technique places a limit on the ability to increase packing density. Another conventional technique uses guard traces interspersed between signal traces. The guard traces and the signal traces in this conventional technique are located in the same level of the circuit board. The guard traces are electrically connected to a ground plane which is located above or below the level of the signal traces and the interspersed guard traces. Here too, the requirement for a discrete ground plane connected to the guard traces typically limits the positioning of the signal traces on a signal layer and thus presents an impediment to packing density.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes forming a first layer of a circuit board with a first signal trace and forming a second layer of the circuit board with a second signal trace. A first guard trace is formed on the first layer and offset laterally from the first signal trace but at least partially overlapping the second signal trace and a second guard trace is formed on the second layer and offset laterally from the second signal trace but at least partially overlapping the first signal trace.

In accordance with another aspect of an embodiment of the present invention, a method of reducing crosstalk in a circuit board is provided that includes using a first signal trace associated with a first layer of the circuit board to convey signals and a second signal trace associated with a second layer of the circuit board to convey signals. A first guard trace is used that is associated with the first layer and offset laterally from the first signal trace but at least partially overlapping the second signal trace and a second guard trace is used that is associated with the second layer and offset laterally from the second signal trace but at least partially overlapping the first signal trace to reduce crosstalk between the first and second signal traces.

In accordance with another aspect of an embodiment of the present invention, a circuit board is provided that includes a first signal trace associated with a first layer of the circuit board and a second signal trace associated with a second layer of the circuit board. A first guard trace is associated with the first layer and offset laterally from the first signal trace but at least partially overlaps the second signal trace and a second guard trace associated with the second layer and offset laterally from the second signal trace but at least partially overlaps the first signal trace.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a printed circuit board, such as a semiconductor chip package carrier substrate, are described herein. One example includes a multi-tiered arrangement of signal trace layers with interspersed ground conductors to provide attenuation of crosstalk. Additional details will now be described.

Figure 1:
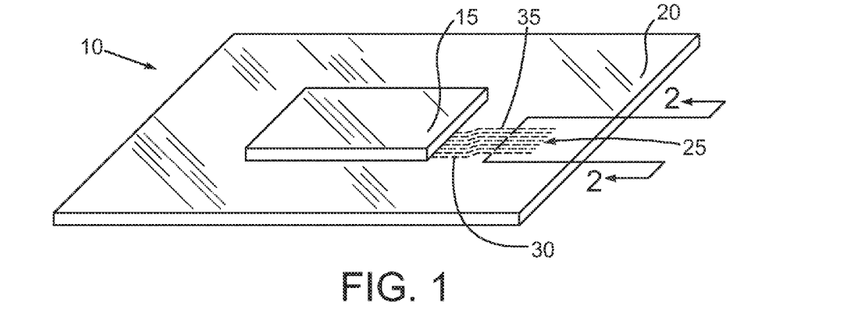
FIG. 1 is a pictorial view of an exemplary embodiment of a semiconductor chip package that includes a semiconductor chip mounted on a circuit board.

In the drawings described below, reference numerals are generally repeated where identical elements appear in more than one figure. Turning now to the drawings, and in particular to FIG. 1, therein is shown a pictorial view of an exemplary embodiment of a semiconductor chip package 10 that includes a semiconductor chip 15 mounted on a carrier substrate 20. The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 15 may be constructed of bulk semiconductor, such as silicon or germanium, or semiconductor on insulator materials, such as silicon-on-insulators materials. The semiconductor chip 15 may be flip-chip mounted to the carrier substrate and electrically connected thereto by solder joints, conductive pillars or other structures (not shown). Optionally, wire bonding may be used.

The carrier substrate 20 may be a package substrate or other type of printed circuit board as described elsewhere herein. Although a monolithic structure could be used for the carrier substrate 20, a more typical configuration will utilize a build-up design. In this regard, the carrier substrate 20 may consist of a central core upon which one or more build-up layers are formed and below which an additional one or more build-up layers are formed. The core itself may consist of a stack of one or more layers. One example of such an arrangement may be termed a so called "2-2-2" arrangement where a single-layer core is laminated between two sets of two build-up layers. The number of layers in the carrier substrate 20 can vary from four to sixteen or more, although less than four may be used. So-called "coreless" designs may be used as well. The layers of the carrier substrate 20 consist of an insulating material, such as various well-known epoxies, interspersed with metal interconnects. A multi-layer configuration other than buildup could be used. Optionally, the carrier substrate 20 may be composed of well-known ceramics or other materials suitable for package substrates or other printed circuit boards.

The carrier substrate 20 is provided with a number of conductor traces and vias and other structures in order to provide power, ground and signals transfers between the semiconductor chip 15 and another circuit device that is not shown. To facilitate those transfers, the carrier substrate may be provided with input/outputs in the form of a pin grid array, a ball grid array, a land grid array or other type of interconnect scheme. A small group 25 of conductor traces is depicted and will be used to describe various characteristics of the disclosed embodiments. It should be understood that there may be conductor traces positioned throughout the entirety of the carrier substrate 20, but for simplicity of illustration only the small group 25 is actually depicted in FIG. 1. The group 25 of conductors may be positioned within the carrier substrate 20 and thus is shown in phantom. Note that the conductors of the group 25 can be shaped with linear, non-linear, or a combination of such elements.

Additional details of the group 25 will be described in conjunction with FIG. 2, which is a sectional view of FIG. 1 taken at section 2-2. For the present purposes, it will be useful to label two of the conductors of the group 25 with element numbers 30 and 35, respectively. Before turning to FIG. 2, attention should be paid to the locations of the conductor lines 30 and 35 relative to section 2-2 so that FIG. 2 may be understood in context. With that backdrop, attention is now turned to FIG. 2. The group 25 may consist of conductor lines 40, 45, 50, 55 and 60 bracketed by the conductor lines 30 and 35. While only a few conductors are depicted, there may be hundreds or more in the carrier substrate 20. In this illustrative embodiment, the conductor lines 30, 35, 45 and 55 and may be connected to ground and the conductor lines 40, 50 and 60 may carry signals. The carrier substrate 20 may consist of a core 65 upon which build up layers 70, 75, 80 and 85 are fabricated. The build-up layer 70 includes a dielectric material layer 90 that generally surrounds conductor lines 95, 100, 105, 110 and 115. The conductor lines 95, 105 and 115 may be connected to ground and the conductor lines 100 and 110 may carry signals. The build-up layer 80 may consist of a dielectric material layer 120 that is interspersed with the aforementioned conductor lines 30, 35, 40, 45, 50, 55 and 60. Plural vias, three of which are labeled 123a, 123b and 123c, may be formed in the dielectric material layer 90 to electrically connect the ground conductors 30, 35, 45 and 55 to the underlying ground conductors 95, 105 and 115.

Turning to the opposite side of the carrier substrate 20, the build-up layer 75 may consist of a dielectric material layer 125 that is interspersed with conductor lines 130, 135, 140, 145 and 150. The build-up layer 85 may include a dielectric material layer 155 that is interspersed with conductor lines 160, 165, 170, 173, 175, 180 and 185. The conductors 130, 140, 150, 160, 170, 173, 175 and 185 may be connected to ground and interconnected to one another by plural vias, one of which is labeled 190. In this way, the various conductors in the build-up layers 75 and 85 essentially mirror the various conductors in the build-up layers 70 and 80 on the opposite side of the core 65. The conductor lines 95, 105 and 115 may be connected to the lines 130, 140 and 150 respectively by way of plated through holes 195, 200 and 205 that extend through the core 65.

Solder masks 210 and 215 may be formed on the build-up layers 80 and 85 respectively. The solder masks 210 and 215 may be fabricated from a variety of suitable materials for solder mask fabrication, such as, for example, PSR-4000 AUS703 manufactured by Taiyo Ink Mfg. Co., Ltd. or SR7000 manufactured by Hitachi Chemical Co., Ltd. The carrier substrate 20 may electrically interface with another circuit device (not shown) by a variety of methods, such as the ball grid array 220 shown, or a pin grid array or land grid array or other type of interconnect structure.

This illustrative embodiment provides for a multi-tiered routing structure for conductor traces that are simultaneously provided with protection against crosstalk. In this regard, the signal traces 100 and 110 may be associated with or constitute one signal routing layer and the conductor traces 40, 50 and 60 may be associated with or constitute a second signal trace routing layer. The term "layer" as used herein intended to encompass spatial separation, whether in separate or the same insulating material layer. The nesting of, for example, the signal trace 40 between the ground conductors 30 and 45 laterally provides protection against crosstalk with the underlying, but laterally separated, signal trace 100. Similarly, the separation of the signal traces 40 and 50 by the ground conductor 45, in this instance acting as a ground guard, attenuates any crosstalk between the signal traces 40 and 50 in the same layer. The same benefits are provided for the various conductors in the build-up layers 75 and 80 on the opposite side of the core 65. It is desirable for the guard trace on one layer to at least partially overlap the signal trace on another level. For example, the guard trace 45 at least partially (and in this completely) overlaps the signal trace 100 and the guard trace 95 similarly overlaps the signal trace 40. The overlaps (partial or complete) leave just a small window between the signal traces 40 and 100 where capacitive and/or inductive coupling could occur. Crosstalk may be reduced when the semiconductor chip 15 (see FIG. 1) is operated to drive signals in one or all of the traces 40, 50, 60, 100 and 110.

Figure 2:
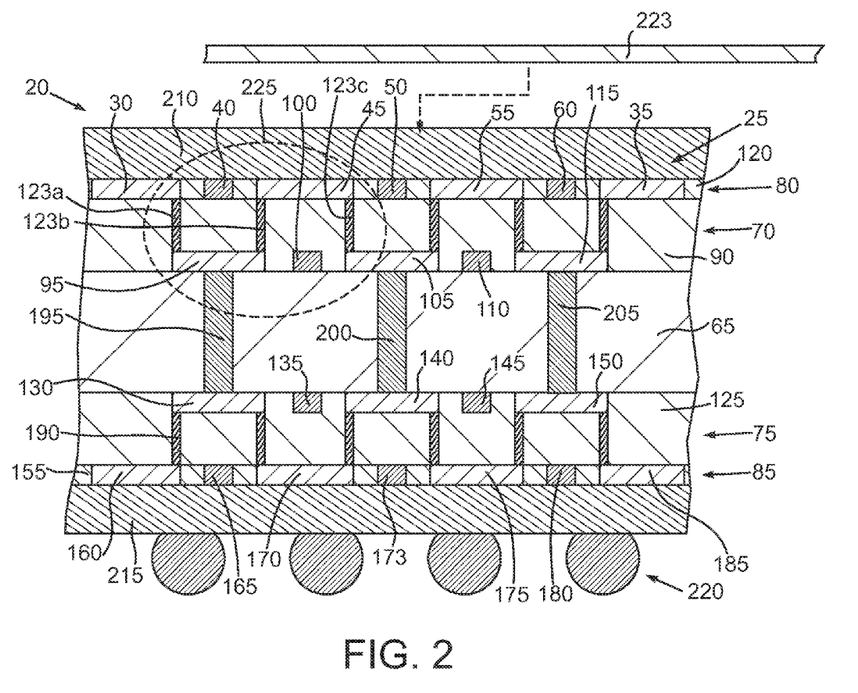
FIG. 2 is a sectional view of FIG. 1 taken at section 2-2.

The illustrative embodiment depicted in FIG. 2 may include one or more power conductors, such as the depicted power plane 223. The power plane 223 could be placed above or below the signal trace layers. Furthermore, it should be understood that more than two signal trace layers could be used. In addition, one or more ground planes could be added.

Figure 3:
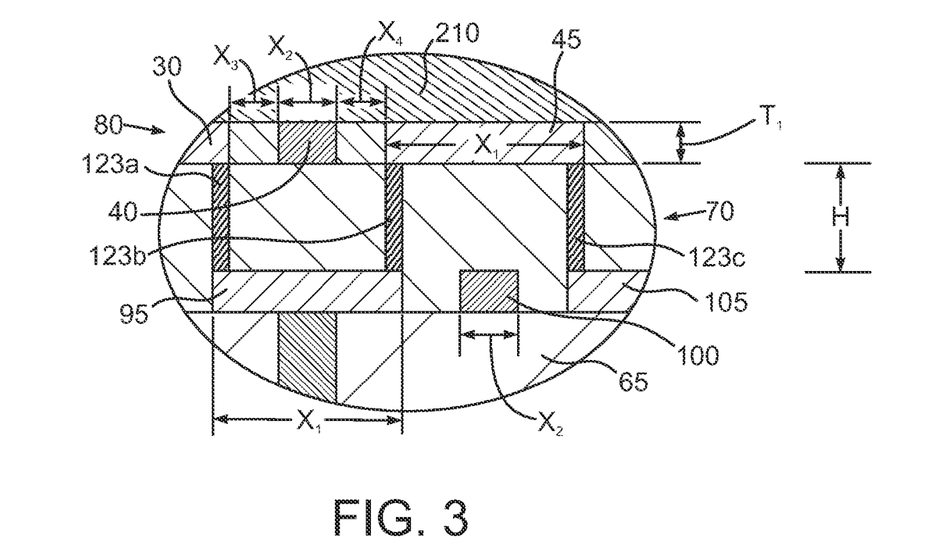
FIG. 3 is a portion of FIG. 2 shown at greater magnification.
Figure 4:
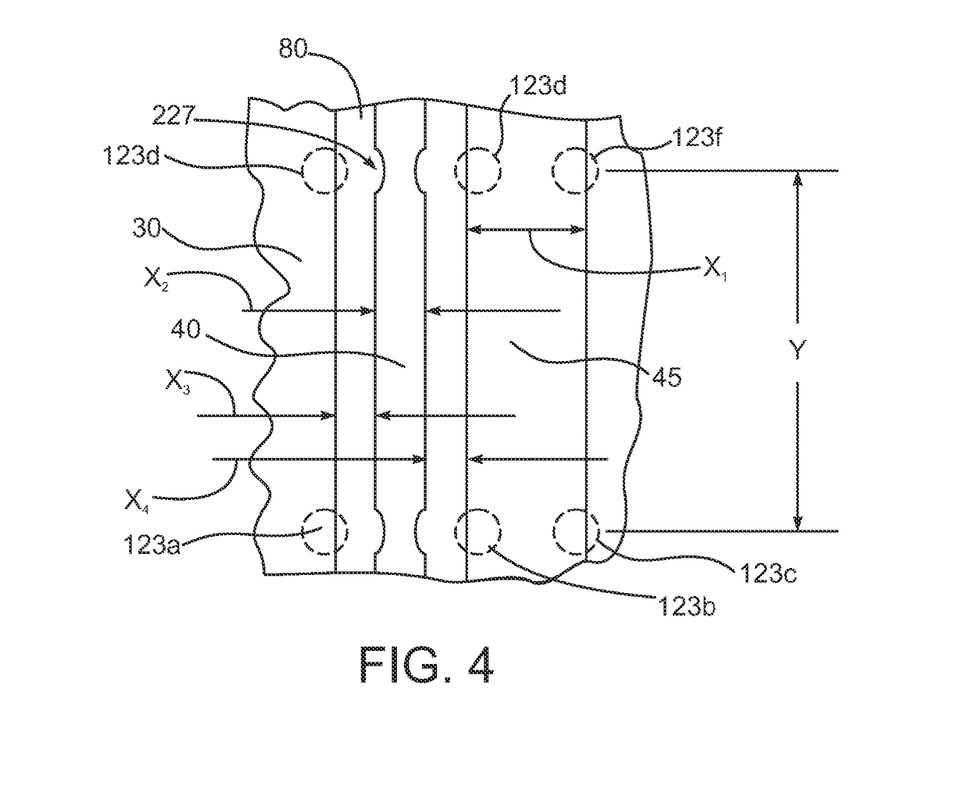
FIG. 4 is an overhead view of some of the structures shown in FIG. 3.

Additional details of this illustrative embodiment will be described in conjunction with FIG. 3, which is the portion of FIG. 2 circumscribed by the dashed oval 225 shown at greater magnification, and FIG. 4, which is an overhead view of what is depicted in FIG. 3, but with the solder mask 210 peeled away. The following components are visible in FIG. 3: a small portion of the solder mask 210, the build-up layer 80, the build-up layer 70, the core 65, the signal trace 40, a portion of the ground conductor 30, the ground conductor 45, a portion of the ground conductor 95, the signal trace 100, a portion of the ground conductor 105, and the vias 123a, 123b and 123c. In FIG. 4, a portion of the ground conductor 30, the signal trace 40, the ground conductor 45, the buildup layer 80, the vias 123a, 123b and 123c, and additional vias 123d, 123e and 123f are visible. Referring to both FIGS. 3 and 4, it may be desirable to fabricate the various conductor structures with geometries that will provide a particular target impedance for a given signal trace, such as the signal trace 40 for example. Thus, the ground conductors 50 and 95 may be fabricated with a width $X_1$ and a thickness T. Similarly, the signal traces 40 and 100 may be fabricated with a width $X_2$ and a thickness, T. The lateral spacings $X_3$ and $X_4$ between, for example, the signal trace 40 and the laterally positioned ground conductors 30 and 45 may be equal or unequal as desired. It may be possible to fabricate the signal traces 40 and 100 with the same or different dimensions lateral. The same is true of the guard traces 30, 45, 95 and 105. The spacing H between the guard traces, say 45 and 95, may also be varied.

The impedance Z of a given signal trace, such as the trace 40, is:

$$Z \propto f(X_1, X_2, X_3, X_4, T, H, \nu) \quad (1)$$

where $\nu$ is the signal frequency. The particular function $f$ that satisfies Equation 1 will typically be empirically derived and vary depending upon overall device geometry size and the composition of the dielectric material layers 90 and 120. However, it will be generally true that the impedance Z will fall if either $X_1$, $X_2$, or T is increased, although the amount of increase will be more gradual with an increase in the width $X_1$. A suitable target impedance Z will again depend upon the device involved and the overall device geometry. In an exemplary embodiment suitable for double data rate memory channels, a target impedance Z for the signal traces 40 and 100 may be about 40 to 60Ω. Exemplary values for this illustrative embodiment may be $X_1$=120 µm, $X_2$=40 µm, $X_3$, $X_4$=40 µm, and T=40 µm. If need be to reduce field effects the proximity with the vias 123a, 123b, 123c, 123d, 123e and 123f, dimples 227 may be formed in the lateral sides of the signal trace 40 (and the other similar traces not shown).

Another parameter that may be controlled to yield desirable reductions in crosstalk is the distance Y between vias as shown in FIG. 4 for the vias 123c and 123f. While the spacing Y will depend on device geometry, better crosstalk reduction will be obtained where:

$$Y \leq \frac{\lambda}{4} \quad (2)$$

where the wavelength $\lambda$ is given by:

$$\lambda = \frac{c}{\nu} \quad (3)$$

Accordingly, the spacing may go up or down with increasing or decreasing device operating frequency.

Computer simulations using Q2D by Ansoft Corporation were used to examine the impact of the multi-tiered signal routing with interspersed ground guards on crosstalk. The simulations assumed a hypothetical double data rate memory channel and computed both near and far end crosstalk in the frequency domain for a configuration like that depicted in FIG. 2 and a conventional design of the type depicted in FIG. 6. The following tables shows the parameters were used for and the results of the simulations for a new configuration and a conventional configuration:

TABLE 1

New Configuration

| | |
|---|---|
| Trace width $X_2$ | 40 µm |
| Spacing with ground $X_3$ | 40 µm |
| Conductor Line Length | 20 mm |
| Frequency Range | 0 to 20 GHz |
| Far End Crosstalk | ≈−30 dB from 0 to 10 GHz |
| Near End Crosstalk | ≈−35 dB from 0 to 10 GHz |

TABLE 2

Conventional Configuration

| | |
|---|---|
| Trace width $X_2$ | 40 µm |
| Spacing with ground $X_3$ | 40 µm |
| Conductor Line Length | 20 mm |
| Frequency Range | 0 to 20 GHz |
| Far End Crosstalk | ≈−23 dB from 0 to 10 GHz |
| Near End Crosstalk | ≈−19 dB from 0 to 10 GHz |

The new configuration shows an improvement in both near and far end crosstalk attenuation.

The various conductor structures of the carrier substrate 20 may be composed of a variety of conductor materials, such as copper, aluminum, silver, gold, platinum, titanium, refractory metals, refractory metal compounds, alloys of these or the like. In lieu of a unitary structure, the conductors may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the conductors. Various well-known techniques for applying metallic materials may be used, such as physical vapor deposition, chemical vapor deposition, plating or the like. Where necessary, openings may be etched in dielectric films using well-known techniques to form vias.

Figure 5:
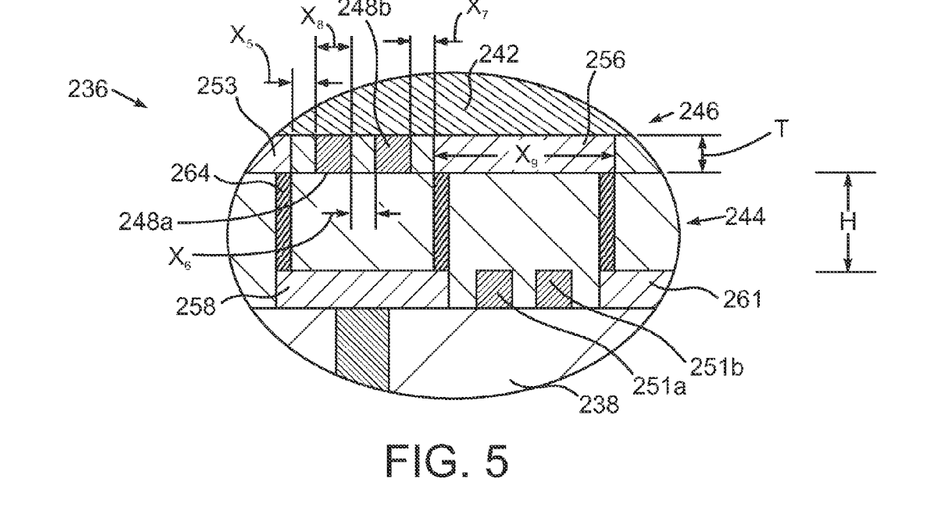
FIG. 5 is a sectional view like FIG. 3 but of an alternate exemplary embodiment of a circuit board.

The general techniques described herein may be extended to a differential signal channel. In this regard, attention is turned now to FIG. 5, which is a sectional view like FIG. 3, but of alternate exemplary embodiment of a circuit board 236. The illustrative embodiment shares various features with the other embodiments described elsewhere herein and may be fabricated using like techniques. Portions of a core 238 and a solder mask 242 are shown along with build up layers 244 and 246. Paired signal traces 248a and 248b are associated with the build up layer 246 and another pair of signal traces 251a and 251b are associated with the build up layer 244. Guard traces 253 and 256 bracket the signal traces 248a and 248b and guard traces 258 and 261 bracket the signal traces 251a and 251b using the same partial or complete overlap as described elsewhere herein. The spacing of interconnecting vias, one of which is labeled 264, along an axis out of the page may be like the spacing Y depicted in FIG. 4. Again, the spacings $X_5$, $X_6$, $X_7$ and, lateral dimensions $X_8$ and $X_9$, thickness T and separation H may be selected to yield a desired impedance for the signal traces 248a, 248b, 251a and 251b. Furthermore, the number of tiers of signal traces may exceed two. And of course, the lateral dimensions and spacings need not be equal.

It may be useful at this juncture to contrast the exemplary embodiments disclosed herein with an exemplary conventional signal trace routing scheme for a conventional package. In this regard, attention is now turned to FIG. 6, which is a sectional view like FIG. 2 but of an exemplary conventional semiconductor chip package carrier substrate 320 that includes a core 325 and upper and lower build-up layers 330, 335, 340 and 345, upper and lower solder masks 350 and 355 and a ball grid array 360. Here, a ground plane 365 is fabricated in conjunction with the build-up layer 335. The ground plane 365 is electrically connected to several ground guards 370, 375 and 380 by respective vias, one of which is labeled 385. The ground guards 370, 375 and 380 bracket signal traces 390 and 395 laterally. A mirror image interconnect scheme is fabricated in conjunction with the build-up layers 340 and 345 but is not separately labeled in FIG. 6 for simplicity of illustration. Plated through holes 400, 405 and 410 provide interconnects through the core 325. Additional ground planes 397 and 398 are typically present. Note that this conventional design provides for signal trace routing only on a single layer namely the layer in association with the build-up layer 330. This of course presents an impediment to the ability to compact the carrier substrate 320.

Figure 6:
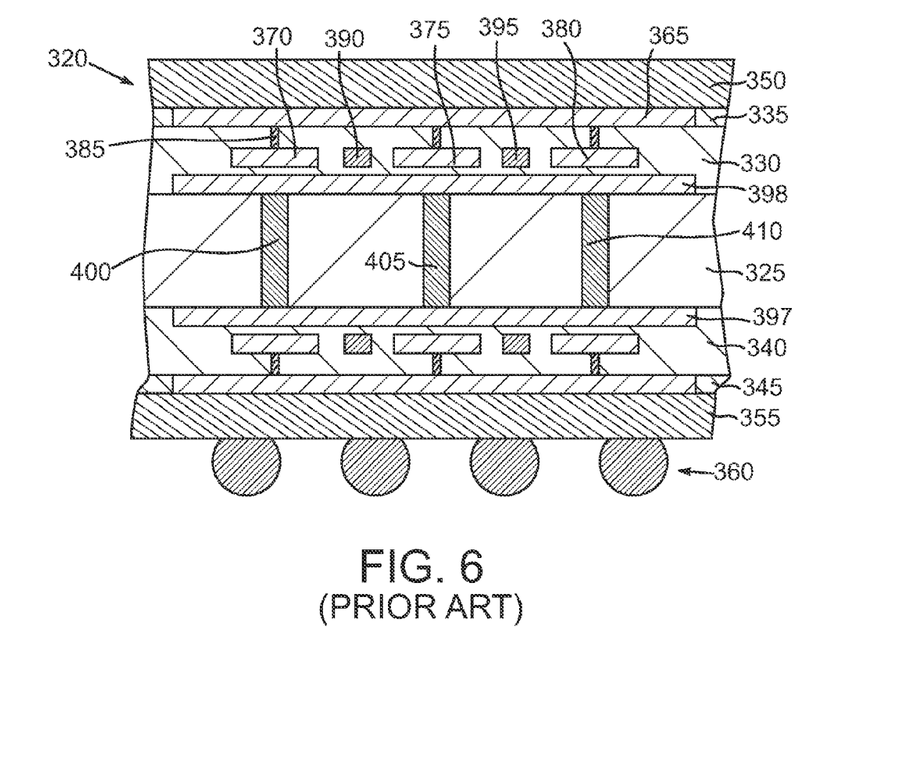
FIG. 6 is a sectional view of a conventional semiconductor chip package substrate.
Figure 7:
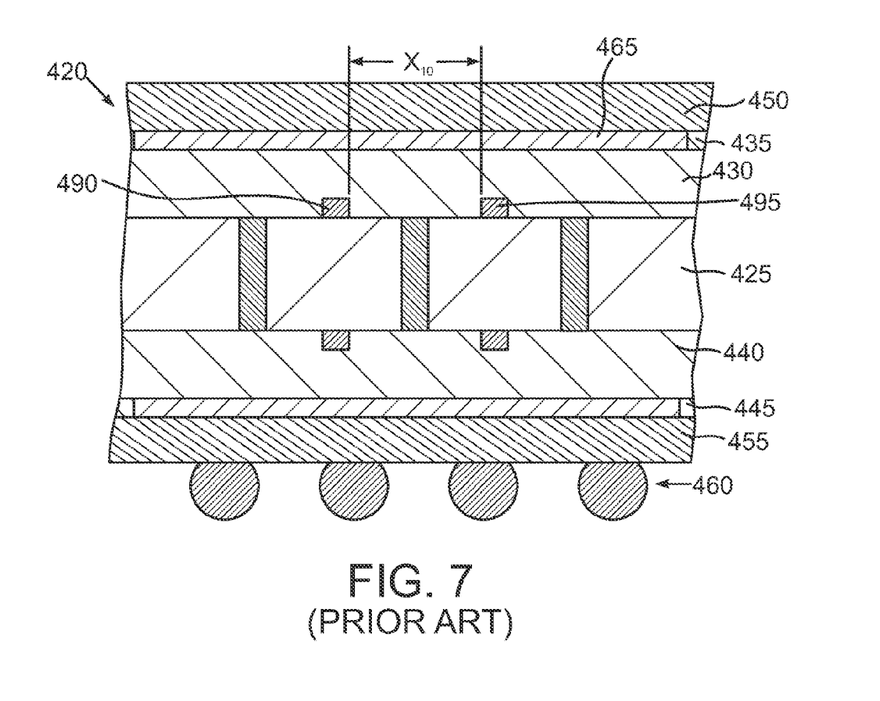
FIG. 7 is a sectional view of another conventional semiconductor chip package substrate.

FIG. 7 depicts a sectional view like FIG. 6 but of another conventional semiconductor chip package substrate 420. The substrate 420 includes a core 425 and upper and lower build-up layers 430, 435, 440 and 445, upper and lower solder masks 450 and 455 and a ball grid array 460. Here, a ground plane 465 is fabricated in conjunction with the build-up layer 435 and is vertically separated from signal traces 490 and 495 that are fabricated in conjunction with the buildup layer 430. Here there are no ground guards or other devices positioned proximate the signal traces 490 and 495 to attenuate crosstalk between the two. Thus, the spacing $X_{10}$ must be carefully tailored in order to keep the level of crosstalk between the lines 490 and 495 at an acceptable level for the substrate 420. Again, the signal traces are positioned on a single layer.

Figure 8:
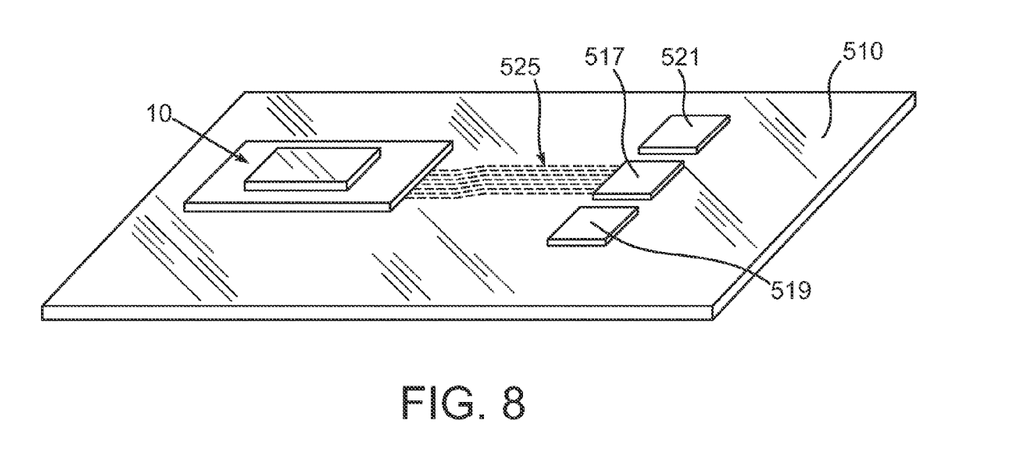
FIG. 8 is a pictorial view of another exemplary circuit board.

It may be possible to merge the multi-tiered signal and ground routing depicted in FIGS. 1, 2 and 3 and described above into other circuit devices. For example, and as shown in FIG. 8, the semiconductor chip package 10 described elsewhere herein may be mounted to another printed circuit board 510 and electrically interfaced with another semiconductor chip 517 by way of a group of conductors 525. Of course, the skilled artisan will appreciate that the printed circuit board 510 may consist of plural build-up layers and include a large number of conductor traces interconnected by vias and other conductor structures that extend throughout the volume of the printed circuit board 510. But for simplicity of illustration, only the small group of conductors 525 is actually depicted in FIG. 8. The group of conductors 525 may be configured generally like the group 25 of conductor structures described above and depicted in FIGS. 1, 2 and 3, albeit in the context of the printed circuit board 510. If desired, the semiconductor chip package 10 may also include the multi-tiered signal and ground routing as described elsewhere herein. Here, the group 525 of conductors may be used to provide electrical interconnects between the semiconductor chip package 10 and the semiconductor chip 517. The semiconductor chip 517 may be, for example, a memory device, a microprocessor, a graphics processor, a combined microprocessor/graphics processor, an application specific integrated circuit or other device. In an exemplary embodiment, the chip 517 may be a GDDR5 memory device. Of course the printed circuit board 510 may include other semiconductor chips 519 and 521 for example which may be a memory device, a microprocessor, a graphics processor, a combined microprocessor/graphics processor, an application specific integrated circuit or other device. The printed circuit board 510 may be a circuit card, a mother board, or virtually any other type of printed circuit board.

Figure 9:
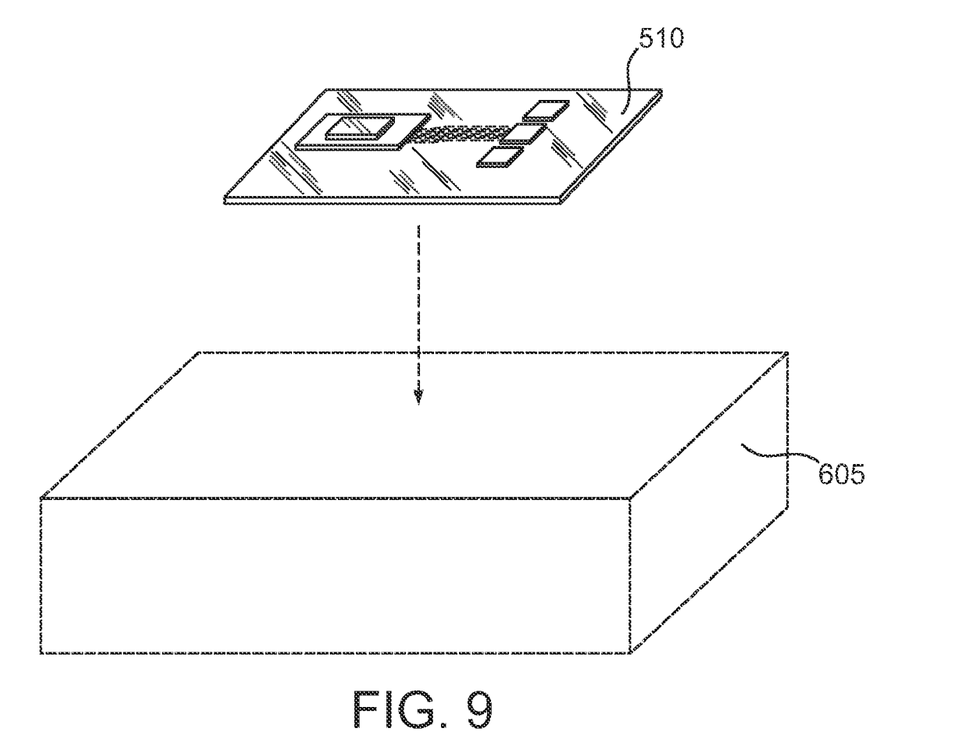
FIG. 9 is an exploded pictorial view of an exemplary circuit board coupled to an electronic device.

FIG. 9 is a partially exploded pictorial view of a electronic device 605 and the printed circuit board 510 previously depicted in FIG. 8. FIG. 9 shows that the printed circuit board 510 may be inserted into the electronic device 605 to provide various types of electronic functionality. The electronic device 605 may be, for example, a computer, a digital television, a handheld mobile device, a personal computer, a server, a memory device, an add-in board such as a graphics card, or any other computing device employing semiconductors.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A circuit board, comprising:
    a first signal trace associated with a first layer of the circuit board and having a first width;
    a second signal trace associated with a second layer of the circuit board and having a second width;
    a first guard trace associated with the first layer and offset laterally from the first signal trace but at least partially overlapping the second signal trace and having a third width;
    a second guard trace associated with the second layer and offset laterally from the second signal trace but at least partially overlapping the first signal trace and having a fourth width; and
    wherein the second width is less than the third width and the first width is less than the fourth width.

2. The apparatus of claim 1, comprising a semiconductor chip coupled to the circuit board.

3. The apparatus of claim 1, comprising a memory device electrically coupled to at least one of the first and second signal traces.

4. The apparatus of claim 1, comprising an electronic device coupled to the circuit board.

5. The apparatus of claim 1, comprising a third signal associated with the first layer of the circuit board and positioned adjacent to the first signal trace and between the first guard trace and the first signal trace.

6. The apparatus of claim 1, wherein the circuit board comprises a multilayer semiconductor chip package substrate.

7. The apparatus of claim 6, wherein the multilayer semiconductor chip package substrate comprises a core with first and second sides and at least one buildup layer on each of the first and second sides.

8. The apparatus of claim 1, wherein the first and second guard traces are electrically coupled.

9. The apparatus of claim 8, wherein the first and second guard traces are electrically coupled by a first conductor coupled between the first and second guard traces and a second conductor coupled between the first and second guard traces and spaced a distance from the first conductor.

10. The apparatus of claim 9, wherein the first and second signal traces are operable to convey signals at a minimum wavelength and the distance is less than or equal to one quarter of the minimum wavelength.

11. A method of manufacturing, comprising:
forming a first guard trace on a first layer of a circuit board and offset laterally from a first signal trace but at least partially overlapping a second signal trace in a second layer of the circuit board, the first guard trace having a first width, the first signal trace having a second width and the second signal trace having a third width;
forming a second guard trace on the second layer and offset laterally from the second signal trace but at least partially overlapping the first signal trace, the second guard trace having a fourth width; and
wherein the third width is less than the first width and the second width is less than the fourth width.

12. The method of claim 11, comprising coupling a semiconductor chip to the circuit board.

13. The method of claim 11, comprising electrically coupling a memory device to at least one of the first and second signal traces.

14. The method of claim 11, comprising forming a power conductor on the circuit board.

15. The method of claim 11, comprising coupling the circuit board to an electronic device.

16. The method of claim 11, comprising forming a third signal trace adjacent to the first signal trace and between the first guard trace and the first signal trace.

17. The method of claim 11, wherein the method is performed by executing instructions stored in a computer readable medium.

18. The method of claim 11, wherein the circuit board comprises a multilayer semiconductor chip package substrate.

19. The method of claim 18, wherein the multilayer semiconductor chip package substrate comprises a core with first and second sides and at least one buildup layer on each of the first and second sides.

20. The method of claim 11, comprising electrically coupling the first and second guard traces.

21. The method of claim 20, wherein the electrically coupling comprises forming a first conductor coupled between the first and second guard traces and a second conductor coupled between the first and second guard traces and spaced a distance from the first conductor.

22. The method of claim 21, wherein the first and second signal traces are operable to convey signals at a minimum wavelength and the distance is less than or equal to one quarter of the minimum wavelength.

23. A method of manufacturing, comprising:
forming a first guard trace on a first layer of a circuit board and offset laterally from a first signal trace but at least partially overlapping a second signal trace in a second layer of the circuit board; and
forming a second guard trace on the second layer and offset laterally from the second signal trace but at least partially overlapping the first signal trace and the first guard trace.

24. A method of reducing crosstalk in a circuit board, comprising:
using a first guard trace associated with a first layer of the circuit board and offset laterally from the first signal trace but at least partially overlapping a second signal trace associated with a second layer of the circuit board and a second guard trace associated with the second layer and offset laterally from the second signal trace but at least partially overlapping the first signal trace to reduce crosstalk between the first and second signal traces; and
wherein the first guard trace has a first width, the first signal trace has a second width, the second signal trace has a third width and the second guard trace has a fourth width and the third width is less than the first width and the second width is less than the fourth width.

25. The method of claim 24, comprising using a third signal trace associated with the first layer and positioned adjacent to the first signal trace to convey signals.

26. The method of claim 24, wherein the circuit board comprises a memory device electrically coupled to at least one of the first and second signal traces.

27. The method of claim 24, wherein the first and second guard traces are electrically coupled.

28. The method of claim 27, wherein the first and second guard traces are electrically coupled by a first conductor coupled between the first and second guard traces and a second conductor coupled between the first and second guard traces and spaced a distance from the first conductor.

29. The method of claim 28, wherein the first and second signal traces are operable to convey signals at a minimum wavelength and the distance is less than or equal to one quarter of the minimum wavelength.

30. The method of claim 24, wherein the circuit board comprises a multilayer semiconductor chip package substrate.

31. The method of claim 30, wherein the multilayer semiconductor chip package substrate comprises a core with first and second sides and at least one buildup layer on each of the first and second sides.

32. The method of claim 24, wherein the circuit board comprises a semiconductor chip.

33. The method of claim 32, comprising operating the semiconductor chip to drive signals through at least one of the first and second signal traces.

* * * * *